United States Patent [19]

Piguet et al.

[11] Patent Number: 5,686,856
[45] Date of Patent: Nov. 11, 1997

[54] MULTIPLEXER OF LOGIC VARIABLES

[75] Inventors: Christian Piguet, Neuchatel; Jean-Marc Masgonty, Corcelles, both of Switzerland

[73] Assignee: Centre Suisse D'Electronique et de Microtechnique S.A., Neuchatel, Switzerland

[21] Appl. No.: 549,253

[22] Filed: Oct. 27, 1995

[30] Foreign Application Priority Data

Oct. 28, 1994 [FR] France .................... 94 12990

[51] Int. Cl.$^6$ .................................... H03K 19/177
[52] U.S. Cl. .......................... 327/407; 326/104
[58] Field of Search ....................... 327/407, 408, 327/409, 410, 411, 412, 413, 99; 326/37, 38, 104, 112

[56] References Cited

U.S. PATENT DOCUMENTS

| | | | |
|---|---|---|---|
| 3,753,009 | 8/1973 | Clapper | 327/210 |
| 3,829,714 | 8/1974 | Vittoz | 327/208 |
| 3,887,822 | 6/1975 | Suzuki | 327/211 |
| 4,057,741 | 11/1977 | Piguet | 327/211 |
| 4,227,097 | 10/1980 | Piguet | 327/210 |
| 4,230,957 | 10/1980 | Piguet | 327/210 |
| 4,593,390 | 6/1986 | Aucun | 370/112 |
| 5,012,126 | 4/1991 | Aucun | 327/410 |
| 5,099,141 | 3/1992 | Utsunomiya | 327/99 |
| 5,140,193 | 8/1992 | Freeman et al. | 326/37 |
| 5,386,154 | 1/1995 | Goetting et al. | 327/407 |
| 5,436,574 | 7/1995 | Veenstra | 327/407 |
| 5,440,245 | 8/1995 | Galbraith et al. | 326/38 |
| 5,463,327 | 10/1995 | Hastie | 326/37 |

OTHER PUBLICATIONS

"CMOS Select 1 of N Multiplexer", IBM Technical Disclosure Bulletin, vol. 27, No. 1B, Jun. 1984, pp. 988–989.

"Select 1 of N Multiplexer", IBM Technical Disclosure Bulletin, vol. 27, No. 2, Jul. 1984, pp. 651–652.

*Primary Examiner*—Timothy P. Callahan
*Assistant Examiner*—My-Trang Nu Ton

[57] ABSTRACT

It comprises first (3) and second (4) transmission logic gates each fed with one input variable. The first gate (3) applies a first elementary logic function (NAND) to one of the input variables and to a multiplexer control logic variable (S). The second gate applies, on the one hand, a second elementary logic function (OR) to the other input variable ($\bar{I}_0$) and to the same control variable (S) and, on the other hand, the first logic function (NAND) to the output (B) of the first gate (3) and to the result of the application of the second logic function (OR), in order to make up the output variable (Q, $\bar{Q}$) of the multiplexer.

13 Claims, 4 Drawing Sheets

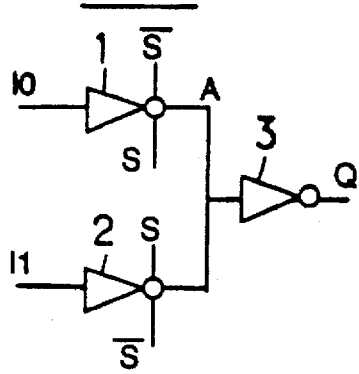
FIG.:1A
(PRIOR ART)
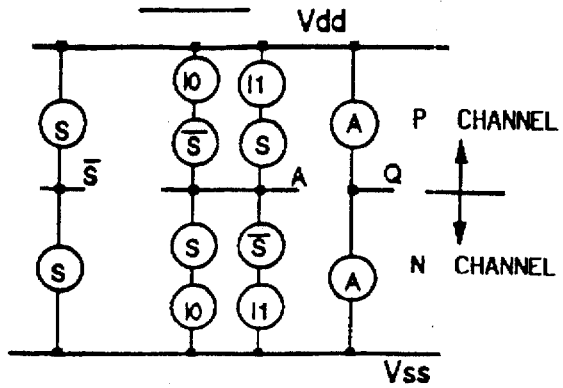
FIG.:1B
(PRIOR ART)
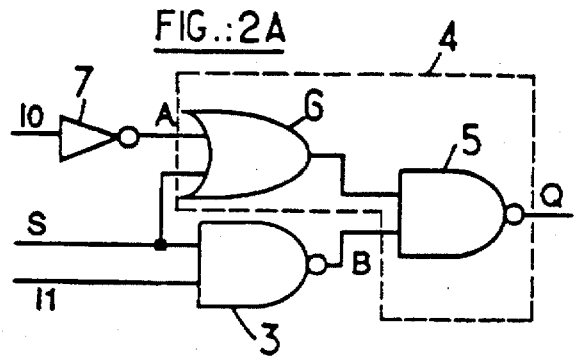
FIG.:2A
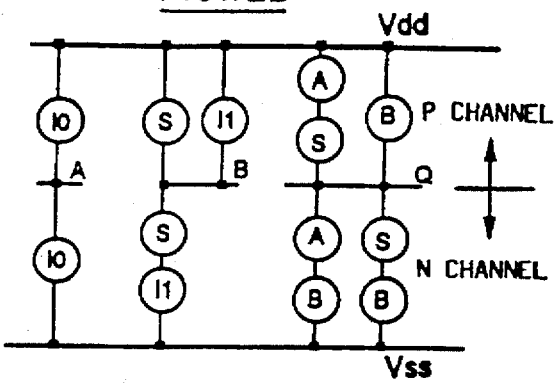
FIG.:2B
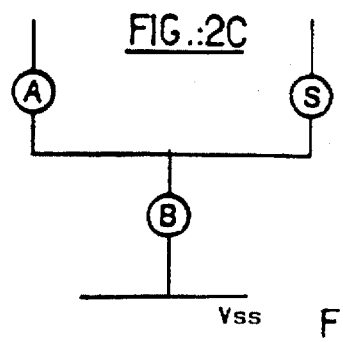
FIG.:2C
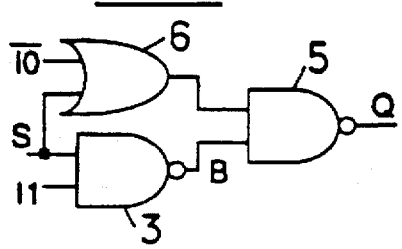
FIG.:3A
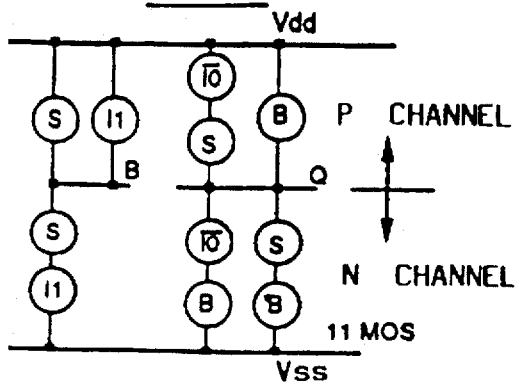
FIG.:3B

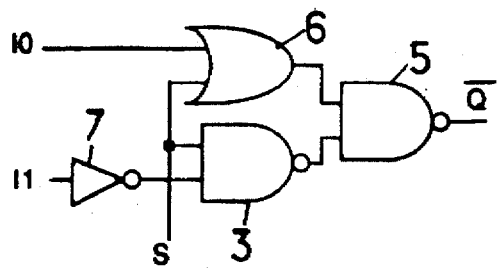
FIG.: 4
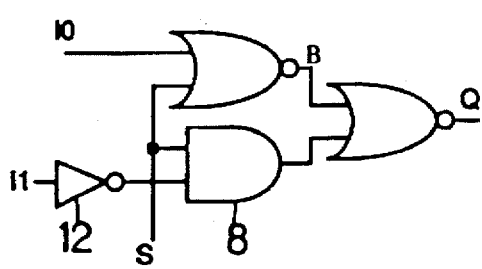
FIG.: 5A
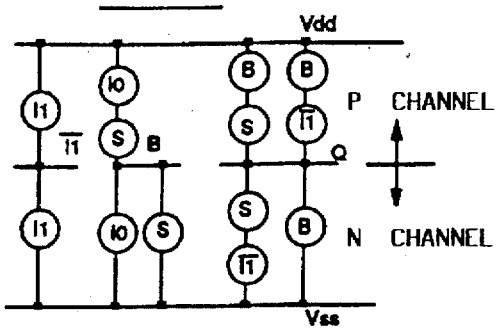
FIG.: 5B
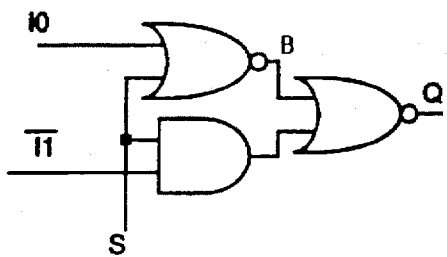
FIG.: 5C
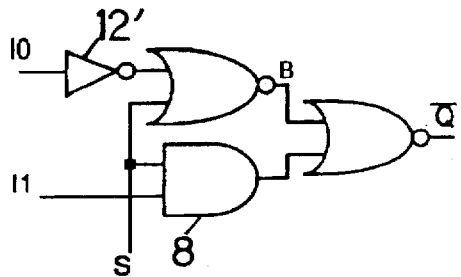
FIG.: 6A
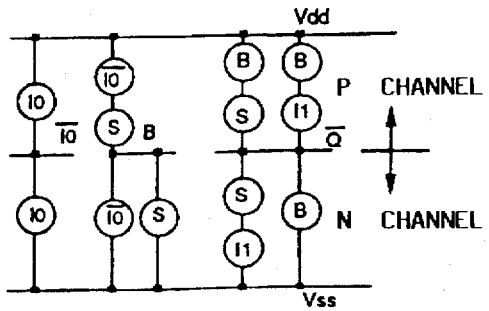
FIG.: 6B

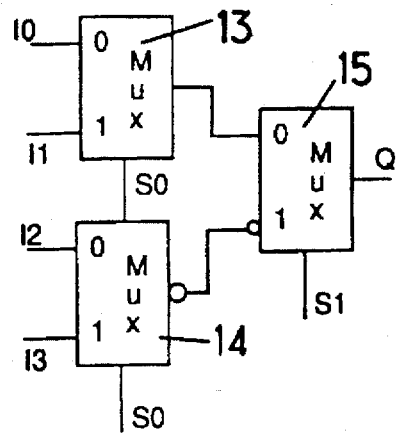
FIG.:7
FIG.:8A
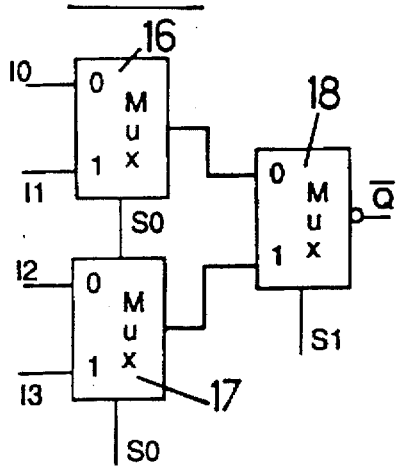
FIG.:8B
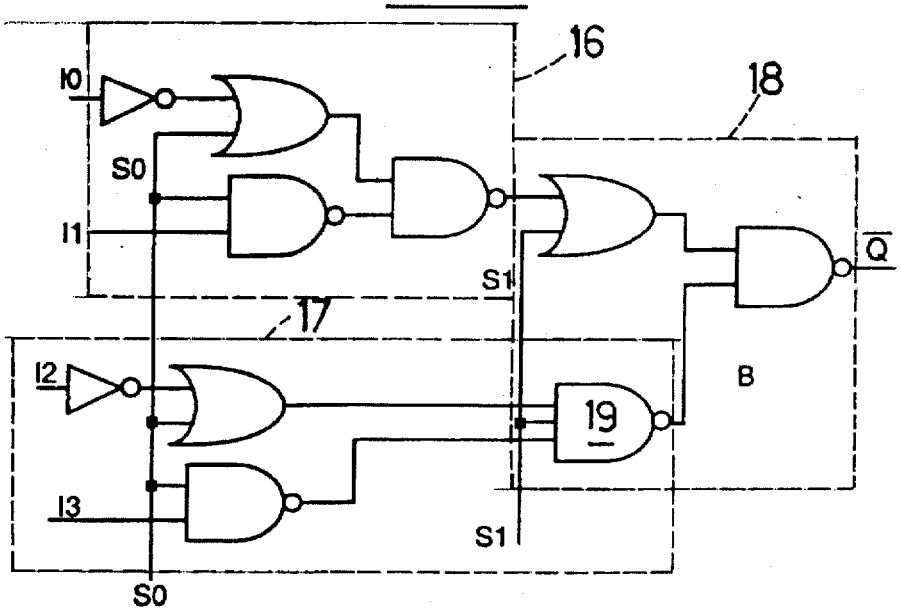

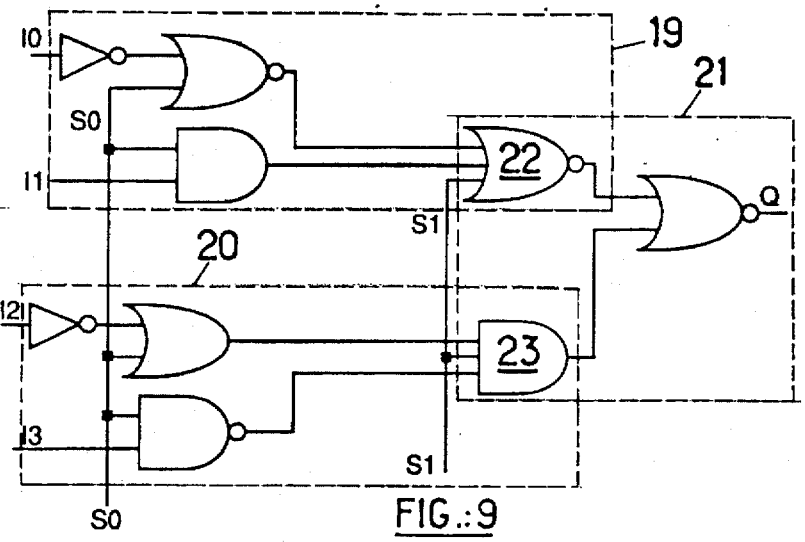
FIG.:9
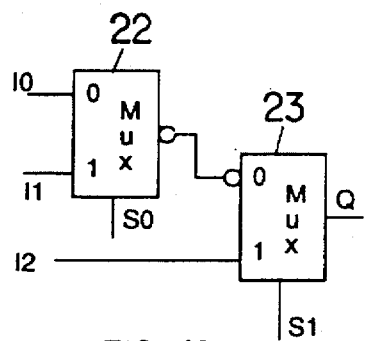
FIG.:10A
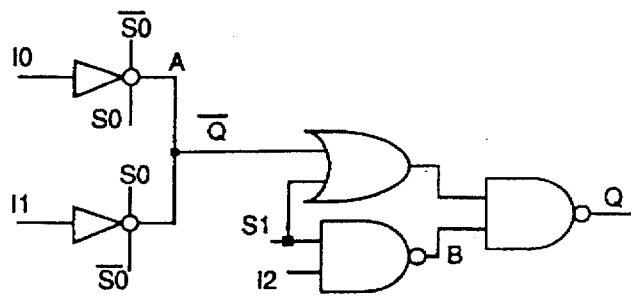
FIG.:10B
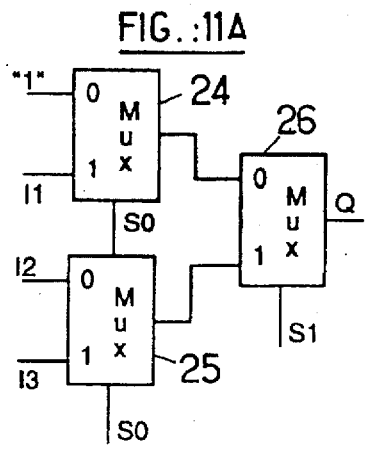
FIG.:11A
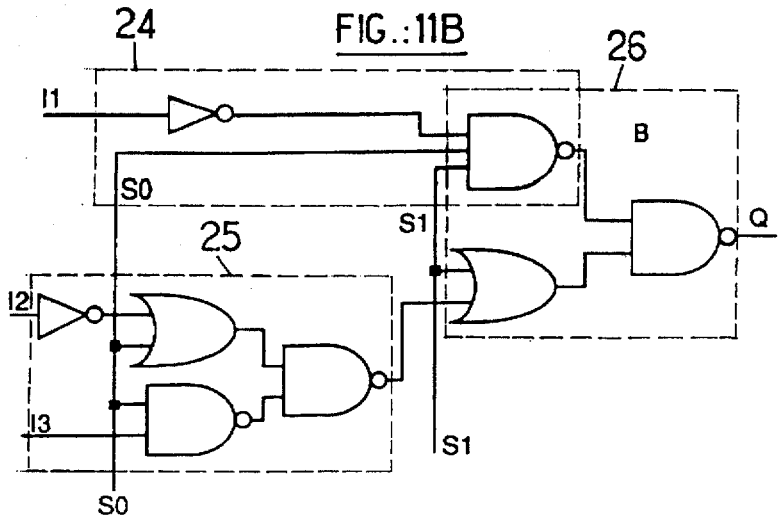
FIG.:11B

MULTIPLEXER OF LOGIC VARIABLES

BACKGROUND OF THE INVENTION

The present invention relates to multiplexers of logic variables and, more particularly, to multiplexers with two inputs and one output and multiplexers with a number of inputs greater than 2 and consisting of a tree structure of such two-input multiplexers.

DESCRIPTION OF THE PRIOR ART

The multiplexer with two inputs $I_0$, $I_1$ and one output Q, represented in FIG. 1A of the attached drawing, is known in the art, in which the variable applied to each input $I_0$, $I_1$ is processed in an inverter 1, 2, respectively, with its output controlled by a multiplexer control signal (S) or by the logical complement $\bar{S}$ of this signal, the outputs of these two inverters also passing selectively into a third inverter 3 at the output of which is found the image of the variable applied to $I_0$ or to $I_1$, according to the state of the control variable S.

A topography of transistors executing the logic functions visible in FIG. 1A, in C2MOS technology, has been represented in FIG. 1B. Each transistor is represented by a circle surrounding the variable controlling the conduction of said transistor, i.e. S, $\bar{S}$, A, the output of the inverters 1 and 2 of FIG. 1A, $I_0$ or $I_1$, the input variables. The transistors are grouped according to their type, P channel or N channel, and are connected in parallel "branches" between one of the terminals $V_{DD}$, $V_{SS}$ of an electrical power supply source and the output nodes for the variables $\bar{S}$, A and Q.

Hence, an inverter consisting of the two transistors S mounted in series between $V_{DD}$ and $V_{SS}$ is recognized in the topography of FIG. 1B, the common terminal of these transistors conventionally delivering $\bar{S}$. Likewise, the inverter 3, consisting of the two transistors A which delivers the output Q by inverting the signal A is recognized. The inverters 1 and 2 consist respectively of the branch containing the P-channel transistors $I_0$, $\bar{S}$, connected in series with the N-channel transistors S, $I_0$ and of the branch containing the P-channel transistors S and $I_1$, connected in series with the N-channel transistors $\bar{S}$, $I_1$, between the two terminals $V_{DD}$ and $V_{SS}$ of the power supply source.

The "branch" structure of this topography is favorable from the point of view of compactness of the integrated circuit thus designed and therefore from the point of view of the reduction in its electrical consumption. However, it may be seen that the transfer of an input variable $I_0$ or $I_1$ to the output Q of the multiplexer involves the transitions, in series, of three "gates" designated by the variable which they deliver, i.e. the gate $\bar{S}$ consisting of the two transistors S situated to the left of FIG. 1B, the gate A consisting of the eight transistors situated in the center of this figure and the gate Q consisting of the two transistors A to the right of the figure. These three transitions therefore involve "time periods" or delays which are cumulative, which is not favorable from the point of view of the speed of the circuit. Moreover, it may be noted that the gate A is set to 1 through two P-channel MOS transistors, which are known not to be very fast.

SUMMARY OF THE INVENTION

The object of the present invention is to produce multiplexers of logic variables exhibiting a high operating frequency or a low electrical energy consumption, or providing a satisfactory compromise between these two conflicting characteristics.

This object of the invention, as well as others which will emerge on reading the description which will follow, is achieved with a multiplexer with two inputs for logic variables and one output, of the type comprising first and second logic gates each fed with one of the inputs, this multiplexer being noteworthy in that the first gate applies a first elementary logic function to one of the input variables and to a multiplexer control logic variable, and in that the second gate applies, on the one hand, a second elementary logic function to the other input variable and to the same control variable and, on the other hand, said first logic function to the output of the first gate and to the result of the application of said second logic function, so as to constitute the multiplexer output variable.

As will be seen in what follows, this multiplexer logic structure makes use only of the "true" form of the control signal. Thus the delay necessary for inverting the latter is avoided, and there is therefore a gain in speed. Therein lies an important advantage particularly in low-consumption circuits which it is desired, however, to make operate at high frequencies.

According to another characteristic of the multiplexer according to the invention, one of the first and second input variables is presented in true form and the other in inverted form possibly via an inverter incorporated in the multiplexer.

According to a first embodiment of the invention, the first and second logic functions incorporated in the gates of the multiplexer are the NAND (inverted AND function) and OR functions respectively.

According to a second embodiment of the invention, the first and second logic functions are NOR (inverted OR function) and AND functions respectively.

Further according to the invention, the multiplexer takes the form of an integrated circuit in CMOS technology, including at least two logic gates each formed by a first group of transistors with a first type of conduction and by a second group of transistors with a second type of conduction, these two groups of transistors being mounted in series between the terminals of a power supply voltage source and their common connection point forming the output node of the gate, the conduction paths of the transistors being mounted in series and/or in parallel within each group in such a way that the state of conduction of these transistors determines the potential of the output node of the gate which represents the internal variable supplied by this gate and which can take values substantially equal to those of the two terminals of the power supply source, the potentials of these terminals each being read as representing one of the two logic states, each transistor being controlled by an internal variable, by the multiplexer control variable or by the multiplexer input variables.

The present invention further makes it possible to produce a multiplexer with $2^n$ logic inputs and one output, including n stages of multiplexers with two inputs and one output, the multiplexers of any one stage i being controlled by the ith bit of an n-bit control word, and these multiplexers being connected in a tree structure, at least one of the latter consisting of a multiplexer with two inputs and one output according to the present invention.

BRIEF DESCRIPTION OF THE DRAWINGS

Other characteristics and advantages of the multiplexer according to the present invention will emerge on reading the description which will follow and on examining the attached drawing in which:

FIGS. 1A and 1B illustrate a multiplexer of the prior art, already described in the preamble to the present description, FIGS. 2A to 2C illustrate a first embodiment of a multiplexer with two inputs and one output according to the present invention, FIGS. 3A and 3B, 4, 5A to 5C, 6A and 6B represent other embodiments of a multiplexer with two inputs and one output according to the present invention, FIG. 7 schematically illustrates a structure of a multiplexer with four inputs and one output according to the present invention, FIGS. 8A, 8B and 9 illustrate variants of multiplexers of from four inputs to one output according to the present invention, and FIGS. 10A, 10B and 11A, 11B illustrate structures of multiplexers with three inputs to one output according to the present invention.

With reference to FIG. 2A of the attached drawing, a first embodiment of a multiplexer according to the invention has been represented, comprising two inputs $I_0$ and $I_1$ and one output Q. This multiplexer consists essentially of two logic gates 3 and 4. The gate 3 executes a first elementary logic function involving the input $I_1$ and a multiplexer control variable S. In the embodiment represented in FIG. 2, this first elementary logic function is the NAND function.

The second gate executes a more complex logic function involving the other input $I_0$, the control variable S and the output B of the gate 3. The second gate 4 therefore consists of two elementary logic gates 5 and 6, the gate 5 executing the same NAND logic function as the gate 3. The elementary logic gate 6 is an OR gate combining the logical complement of the input $I_0$ and the control variable S. This logical complement is obtained from an inverter 7 incorporated in the multiplexer. Under certain circumstances, this inverter may be omitted as will be seen later. In the remainder of the present description, the gates 3, 4 and 7 will be designated by the variables which they deliver, i.e. B, Q and A respectively.

A topography of CMOS transistors implementing the multiplexer structure shown schematically in FIG. 2A has been represented in FIG. 2B. The conventional arrangement into two groups of P-channel and N-channel transistors respectively, already used in FIG. 1B, is again found. The output nodes A, B, Q, which are common to each pair of groups of opposite types, correspond to the outputs of the three gates defined in connection with FIG. 2A. Hence the inverter A is again found in the two $I_0$ transistors, the P-channel and N-channel transistors respectively, arranged in series between the terminal $V_{DD}$, $V_{SS}$ of the electrical power supply source. The gate B consists of a first group of P-channel transistors comprising a transistor S in parallel with a transistor $I_1$ and of a second group of N-channel transistors consisting of transistors S and $I_1$ in series. The gate Q consists of a first group of P-channel transistors including a transistor B in parallel with a branch comprising a transistor A and a transistor S in series, and of a second group of N-channel transistors formed from a first branch numbering a transistor A and a transistor B in series, this branch being in parallel with a second branch comprising a transistor S in series with a transistor B.

It may be noted that this topography numbers thirteen MOS transistors, whereas that of the prior art represented in FIG. 1B numbers only twelve. It is clear, however, that the number of transistors of the topography of FIG. 2B could be brought back to twelve by replacing the two transistors B placed in parallel branches by a single transistor B, as represented in FIG. 2C. Above all, it may be noted that the delay between the inputting of the control variable S and the output Q consists of the accumulation of the transition times of two gates at most, that of the gate B and that of the gate Q, whereas the delay corresponding to the multiplexer of FIGS. 1A, 1B consists of the transition times of three gates. The multiplexer according to the invention is therefore faster, for equal consumption, than that of FIGS. 1A, 1B.

Moreover, detailed analysis, on a state table, of the circuit of FIG. 2B shows that it includes only one single course (between gates B and Q), introducing stray transient variations in the voltage levels read on the output Q, levels which should normally be equal either to $V_{DD}$ or $V_{SS}$. These variations are very simply avoided, according to the invention, by making one of the gates transit more rapidly than the other. In the present case, with gate B being simpler than gate Q, it is easy, by appropriate dimensioning of the MOS transistors used, to arrange that gate B transits faster than gate Q.

It will be noted furthermore that the transition to $V_{DD}$ Of gate Q is itself fast since this gate is set to "1" (i.e. $V_{DD}$) via a single P-channel transistor (transistor B) and not through two such transistors, is the case for gate A of the circuit of FIG. 1B.

Under certain circumstances an inverted input, $\bar{I}_0$ for example, is automatically available. It is then possible to further reduce the number of transistors constituting a multiplexer according to the invention, as represented in FIGS. 3A, 3B. The multiplexer represented in FIG. 3 comprises elementary gates 3, 5 and 6 which are identical to the gates 3, 5 and 6 respectively of the multiplexer of FIG. 2A and are interconnected in the same way. Feeding the circuit of FIG. 3A via an $\bar{I}_0$ input rather than $I_0$ makes it possible to dispense with the inverter which is found in FIG. 2A, and thus two transistors, as is apparent in the topography of transistors of FIG. 3B, which, for the rest, is identical to that of FIG. 2B.

Under other circumstances, it is desired to have an inverted output $\bar{Q}$ available, rather than the true output Q. The multiplexer represented in FIG. 4 answers this situation. It comprises gates 3, 5, 6 which are identical to the gates 3, 5, 6 of the multiplexer of FIG. 2, and an inverter 7 placed this time on the input of the NAND gate 3 which normally receives $I_1$. Such a circuit numbers thirteen transistors. As before, if $\bar{I}_1$ is naturally available, this number can be reduced to eleven by virtue of the inverter 7 being dispensed with.

Obviously, the dual forms of any multiplexer topography according to the invention may themselves constitute such a multiplexer. By way of example, the circuit which is the dual form of the circuit of FIG. 2 has thus been represented in FIG. 5A. The circuit of FIG. 5A comprises a first gate B of the NOR type fed with $I_0$ and S and a second gate consisting of a gate 8 of the AND type fed with $I_1$ and S, the output of this gate being combined with the output of gate B in another NOR gate delivering the output Q.

The topography of this circuit is represented in FIG. 5B. It is derived from that of FIG. 2B by exchanging the inverters giving $\bar{I}_0$ and $\bar{I}_1$ and exchanging the topographies of the groups of N-channel and P-channel transistors. This structure with thirteen MOS transistors may further be reduced to eleven if, as represented in FIG. 5C, the input $\bar{I}_1$ is naturally available, which makes it possible to do without the inverter 12 of FIG. 5A.

The structures of FIGS. 5A and 5C may naturally be declined to form other structures such as those represented in FIG. 6A which deliver $\bar{Q}$ instead of Q. The latter structure consists of gates 8, B and $\overline{Q}$ which are identical to the gates 8, B and Q of the structure of FIG. 5A. It comprises an inverter 12' on the input of gate B which receives $I_0$. A topography of transistors making it possible to produce this structure is represented in FIG. 6B. The two transistors $I_0$ constituting the inverter 12', the P-channel transistors S and $I_0$ in series and the N-channel transistors $\overline{I}_0$ and S in parallel with gate B are again found therein, as are finally, the P-channel transistors B and S in series in a branch in parallel with a branch containing B and $I_1$ and the N-channel transistor B in parallel with a branch containing transistors S and $I_1$, constituting the gate $\overline{Q}$. The number of transistors of this topography could be reduced from 13 to 12 by replacing the two transistors B by a single one in the gate $\overline{Q}$, as represented in FIG. 2C, or even to 10 if $\overline{I}_0$ is available directly.

More generally, the present invention makes it possible to produce multiplexers comprising more than two logic inputs, for example $2^n$ being an integer greater than 1, such a multiplexer consisting of a tree structure of n stages of two-input multiplexers according to the invention. The multiplexers of the ith stage are controlled conventionally by the ith bit $S_i$ of an n-bit control word $(S_0 S_1 \ldots S_i \ldots S_{n-1})$ providing selection of a particular input to be transmitted to the output Q of the multiplexer.

By way of example, FIG. 7 illustrates the structure of a multiplexer with four (n=2) inputs $I_0, I_1, I_2, I_3$ according to the invention, controlled by a word $(S_0 S_1)$. It comprises two stages of two-input multiplexers, the first stage comprising multiplexers 13, 14 with inputs $(I_0, I_1)$ and $(I_2, I_3)$ respectively, these multiplexers being controlled by the $S_0$ bit of the control word, and the second stage consisting of a single multiplexer 15 the inputs of which are connected to the outputs of the two multiplexers of the first stage, the output of the multiplexer 15 constituting that of the four-input multiplexer.

According to one embodiment of this multiplexer, the two-input multiplexers 13, 14 and 15 may consist of those represented in FIGS. 2, 4 and 5C, respectively. The topography of the assembly then numbers 37 MOS transistors.

Another embodiment of a four-input multiplexer according to the invention, which delivers a complemented output $\overline{Q}$ which is useful in certain applications, as was seen above, has been represented in FIGS. 8A, 8B. As represented in FIG. 8A, such a multiplexer may consist of three two-input multiplexers 16, 17 and 18 the first two multiplexers of which are in accordance with that of FIG. 2 and the third with that of FIG. 4.

FIG. 8B represents the configuration of gates of a variant of the multiplexer of FIG. 8A, which makes it possible to reduce the number of transistors necessary. In order to do this, the NAND gate 19 is common to the multiplexers 17 and 18 and then numbers three inputs. The topography of CMOS transistors necessary to produce such a multiplexer then numbers only thirty-six transistors in a layout consisting exclusively of parallel branches, and even only thirty-two transistors if this constraint is ignored.

FIG. 9 represents a configuration of gates of a multiplexer with four inputs $I_0$ to $I_3$, which goes further towards reducing the number of CMOS transistors necessary. Three multiplexer 19, 20, 21 respectively in accordance with those represented in FIGS. 6A, 2 and 5C are recognized in this configuration. The output multiplexer 21 comprises a NOR gate 22 common with the multiplexer 19 and a AND gate 23 common with the multiplexer 20. The topography of CMOS transistors necessary to produce such a four-input multiplexer numbers thirty-six transistors in a layout consisting exclusively of parallel branches. If this constraint is ignored, the topography numbers only thirty transistors.

FIGS. 10A, 10B show that it is possible to combine a two-input multiplexer according to the invention with conventional multiplexers, so as to constitute a multiplexer with three inputs $I_0, I_1, I_2$ for example. As represented in FIG. 10A, this multiplexer comprises a multiplexer 22 with two inputs $I_0, I_1$ and another multiplexer 23 with two inputs consisting of the output of the multiplexer 22 and the input $I_2$. As represented in FIG. 10B, the multiplexer 22 may be of the conventional C2MOS type represented in FIG. 1, with two inverters controlled by control signals S, $\overline{S}$, without inversion of its output which then feeds a OR gate of the multiplexer 23 of the type represented in FIG. 3A. The non-inversion of this output saves two MOS transistors, and the assembly then numbers 21 transistors (10+11) instead of 23.

The overall layout of a three-input multiplexer according to the invention, obtained from a four-input multiplexer layout in which one of the inputs, $I_0$ for example, is fixed or "hard-wired" to "1", has been represented in FIG. 11A. The three two-input multiplexers 24, 25, 26 of FIG. 11A are again found in the logic layout of FIG. 11B. If the multiplexers 25 and 26 are of the type of that of FIG. 2, the "multiplexer" 24 reduces to an inverter 27 feeding one input of the NAND gate 28 common to the multiplexers 24 and 26. This logic structure can thus only be produced with twenty-eight transistors in CMOS technology.

It is now apparent that the invention makes it possible to construct multiplexers, with two or more inputs, which can be optimized with respect to the conflicting characteristics of electrical consumption and of operating frequency on the one hand, and as far as the compactness of the transistor topographies to be used to produce such multiplexers is concerned. In particular, the enhancement of the speed which results from the elimination of the inversion of the control signal and the use of topographies which are essentially in parallel "branches" to increase the compactness of these topographies, which is favorable to lowering the electrical consumption, will be noted. The multiplexers according to the invention lend themselves to incorporation in a "library" of basic circuits, which can be systematically used by designers of integrated circuits, especially integrated circuits with low electrical consumption.

Clearly the invention is not limited to the embodiments described and represented, which have been given only by way of example. Thus the present invention also covers multiplexers with a number of inputs greater than 4 and any dual form, not represented, of the topographies described, such multiplexers and dual forms being able to be readily set up by a person skilled in the art from the teachings contained in the present description.

We claim:

1. A multiplexer with two inputs designated ($I_0$, $\overline{I}_0$, and $I_1$, $\overline{I}_1$ for logic variables and one output, designated 0, $\overline{0}$, comprising first and second logic gates each fed with one of the inputs, wherein the first gate applies a first elementary logic function to one of the input variables and to a multiplexer control logic variable, designate S, and wherein the second gate applies, a second elementary logic function to the other input variable and to said control logic variable and, the first elementary logic function to the output of the first gate and to the result of the application of the second elementary logic function, to generate the multiplexer output variable.

2. The multiplexer as claimed in claim 1, wherein one of the first and second input variables is presented in true form and the other in inverted form.

3. The multiplexer as claimed in claim 2, wherein the first and second logic functions are NAND and OR functions respectively.

4. The multiplexer as claimed in claim 2, wherein the first and second logic functions are NOR and AND functions respectively.

5. The multiplexer as claimed in claim 2, which takes the form of an integrated circuit comprising CMOS transistors, including at least two logic circuits each formed by a first group of transistors of a first conduction type and by a second group of transistors of a second conduction type, such two groups of transistors being connected in series between the terminals of a power supply voltage source, such two groups of transistors having a common connection point forming the output node of the circuit, the conduction paths of the transistors being connected in series and/or in parallel within each group for causing such node to take potentials substantially equal to one or the other of the two terminals of the power supply source, depending on the state of conduction of said transistors, said potentials representing the internal variable supplied by the circuit and corresponding to one of two logic states, each of said transistors being controlled either by one of said internal variables, by said multiplexer control logic variable or by one of said inputs.

6. The multiplexer as claimed in claim 5, wherein said at least two logic circuits comprise (FIG. 2B) an Inverter A, a Gate B and a Gate Q, each of said circuits being designated by the internal variable (A,B,Q) that it supplies, each of said circuit consisting essentially of the transistors indicated below for each of said groups, each of said transistors being designated by the variable that controls it, the conduction paths of the transistors of each group being designated as being in series or in parallel with each other, with a connection indicated between parentheses being considered as a unit;

Inverter A: first group $I_0$, second group $I_0$,

Gate B: first group S,$I_1$ in parallel, second group S, $I_1$ in series

Gate Q: first group (A, S in series), B in parallel, second group (A, B in series), (B, S in series) in parallel, or (A, S in parallel) B in series.

7. The multiplexer as claimed in claim 5, wherein said at least two logic circuit comprise (FIG. 5B) an Inverter $I_1$, a Gate B and a Gate O, each of said circuits being designated by the internal variable (A,B,O) that it supplies, each of said circuits consisting essentially of the transistors indicated below for each of said groups, each of said transistors being designated by the variable that controls it, the conduction paths of the transistors of each group being designated as being series or in parallel with each other, with a connection indicated between parentheses being considered as a unit;

Inverter $I_1$: first group $I_1$, second group $I_1$

Gate B: first group $I_0$, S in series, second group $I_0$, S in parallel

Gate Q: first group (B, S in series), (B, $\bar{I}_1$ in series) in parallel or (S, $\bar{I}_1$, in parallel), B in series, second group (S, $\bar{I}_1$ in series), in parallel.

8. The multiplexer as claimed in claim 5, wherein said logic circuits comprise (FIG. 3B) at Gate B and a Gate Q each of said gates being designated respectively by the internal variable that it supplies, each of said gates consisting essentially of the transistors indicated below for each of said groups, each of said transistors being designated by the variable that controls it, the conduction paths of the transistors being designated in each group as being as being series or in parallel with each other with a connection indicated between parentheses being considered as a unit;

Gate B: first group S, $I_1$, in parallel, second group S, $I_1$, in series,

Gate Q: first group, ($\bar{I}_0$, S in series), B in parallel, second group ($\bar{I}_0$, B in series), (S, B in series) or ($\bar{I}_0$, S in parallel), B in series.

9. The multiplexer as claimed in claim 5, wherein said logic circuits comprise (FIG. 6B:) and Inverter $\bar{I}_0$, a Gate B and a Gate $\bar{Q}$, each of said circuits being designated by the internal variables ($\bar{I}_0$, B,$\bar{Q}$) that they supply, each of said circuits consisting essentially of the transistors indicated for each of said groups, each of said transistors being designated by the variable that controls it, the conduction path of the transistors being indicated of each group as being in series or in parallel with each other with, a connection indicated between parentheses being considered as a unit:

Inverter $\bar{I}_0$: first group $I_0$, second group $I_0$

Gate B: first group S, $\bar{I}_0$ in series second group S, $\bar{I}_0$ in parallel gate $\bar{Q}$: first group (B, S, in series), (B, $I_1$ in series), in parallel, or (S, $I_1$, in series), B in parallel.

10. A multiplexer having $2^n$ logic inputs and one output, comprising n stages (n>1) of two-input multiplexers connected in a tree structure, the multiplexers of any one stage (i) being controlled by the ith bit of an n-bit control word at least one of said two-input multiplexers comprising first and second logic gates each fed with one of the inputs, wherein the first gate applies a first elementary logic function to one of the input variables and to a multiplexer control logic variable, and wherein the second gate applies, a second elementary logic function to the other input variable and to the control logic variable and, the first elementary logic function to the output of the first gate and to the result of the application of the second elementary logic function, to generate the multiplexer output variable.

11. The multiplexer as claimed in claim 10, in which n=2, which comprises a first stage of two multiplexers in parallel, each with two inputs and the outputs of which are connected to the inputs of a single multiplexer forming the output stage, the outputs of the two multiplexers of the first stage being true and inverted, respectively, the inverted output being connected to a inverting input of the output multiplexer.

12. The multiplexer as claimed in claim 10, wherein at least one elementary logic gate is shared between two multiplexers belonging to two consecutive stages.

13. The multiplexer as claimed in claim 10, which consists of a structure with two stages of multiplexers with two inputs and one output, one of the inputs of one of the multiplexers of the stage receiving the inputs being hard-wired to "1", so as to constitute a three-input multiplexer.

* * * * *